United States Patent
Yoo et al.

(10) Patent No.: US 9,525,014 B2
(45) Date of Patent: Dec. 20, 2016

(54) ORGANIC LIGHT EMITTING DISPLAY DEVICE

(71) Applicant: SAMSUNG DISPLAY CO., LTD., Yongin, Gyeonggi-Do (KR)

(72) Inventors: Hee-Soo Yoo, Yongin (KR); Mu-Gyeom Kim, Yongin (KR); Hye-Jin Joo, Yongin (KR); Hyo-Shin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 658 days.

(21) Appl. No.: 14/060,520

(22) Filed: Oct. 22, 2013

(65) Prior Publication Data

US 2014/0312321 A1  Oct. 23, 2014

(30) Foreign Application Priority Data

Apr. 18, 2013 (KR) ........................ 10-2013-0042599

(51) Int. Cl.
*H01L 51/50* (2006.01)
*H01L 51/52* (2006.01)
*H01L 27/32* (2006.01)

(52) U.S. Cl.
CPC ......... *H01L 27/326* (2013.01); *H01L 27/3234* (2013.01)

(58) Field of Classification Search
CPC .................... H01L 27/14625–27/14629; H01L 27/3223–27/3234
See application file for complete search history.

(56) References Cited

U.S. PATENT DOCUMENTS

| | | | |
|---|---|---|---|
| 2005/0264190 A1* | 12/2005 | Park | H01L 27/3232 313/506 |
| 2012/0105400 A1 | 5/2012 | Mathew et al. | |
| 2012/0106063 A1 | 5/2012 | Mathew et al. | |
| 2015/0076475 A1* | 3/2015 | Hirakata | H01L 27/14625 257/40 |

FOREIGN PATENT DOCUMENTS

| | | | | |
|---|---|---|---|---|
| JP | 2007-124559 | | 5/2007 | |
| JP | EP 2523033 A1 * | | 11/2012 | ........... G02B 26/023 |
| KR | 10-2012-0046035 | | 5/2012 | |
| KR | 10-2012-0046040 | | 5/2012 | |
| WO | WO 2010005979 A2 * | | 1/2010 | ............. G02B 26/02 |

* cited by examiner

*Primary Examiner* — Mariceli Santiago
(74) *Attorney, Agent, or Firm* — Lewis Roca Rothgerber Christie LLP (57) ABSTRACT

An organic light emitting display device includes a first substrate having a plurality of organic light emitting structures thereon, a second substrate facing the first substrate to encapsulate the organic light emitting structures, an aperture under a lower surface of the first substrate, and an aperture controller under the lower surface of the first substrate. The organic light emitting structures define a pixel area. The second substrate has a light absorption area. The aperture corresponds to the light absorption area. The aperture controller is adjacent to the aperture.

20 Claims, 5 Drawing Sheets

ORGANIC LIGHT EMITTING DISPLAY DEVICE

CROSS-REFERENCE TO RELATED APPLICATION

This application claims priority and the benefit of Korean Patent Application No. 10-2013-0042599, filed on Apr. 18, 2013, the entire contents of which are incorporated by reference herein.

BACKGROUND

1. Field

Example embodiments of the invention relate to a display device. More particularly; example embodiments of the invention relate to an organic light emitting display device.

2. Description of the Related Art

An organic light emitting display ("OLED") device may include a layer of organic materials between two electrodes, i.e., an anode and a cathode. Positive holes from the anode may be coupled with electrons from the cathode in the organic layer between the anode and the cathode to emit light. The OLED device may have a variety of features such as a wide viewing angle, a rapid response rate, relatively thin thickness, and low power consumption.

According to recently developed display technologies, when an image is not represented on a screen, a display device may be used as a mirror. For example, a metal layer having a high reflectivity may be used for an upper substrate, so that a user may use the OLED device as a mirror as well. Also, when the user takes a photograph with the OLED device, an additional camera may be used to display an image on the screen of the OLED device.

However, because an image displayed on the screen of the OLED device and the additional camera may be driven together, power consumption of the OLED may be increased. Further, technologies to use the metal layer to take photographs have not been developed.

SUMMARY

One or more example embodiments of the invention provides an organic light emitting display device capable of taking photographs using external light without any image displayed on a screen.

In an example embodiment of the present invention, an organic light emitting display device includes: a first substrate having a plurality of organic light emitting structures thereon, the organic light emitting structures defining a pixel area; a second substrate facing the first substrate to encapsulate the organic light emitting structures, the second substrate having a light absorption area; an aperture under a lower surface of the first substrate corresponding to the light absorption area; and an aperture controller under the lower surface of the first substrate, the aperture controller being adjacent to the aperture.

Each of the organic light emitting structures may include a first electrode, an organic light emitting element on the first electrode, and a second electrode on the organic light emitting element.

A portion of the pixel area may overlap the light absorption area.

The portion of the pixel area overlapping the light absorption area may include a light transmitting portion.

A size or a shape of the light transmitting portion may be adjustable according to an open area of the aperture.

The organic light emitting display device may further include a metal pattern between the first substrate and the aperture.

The organic light emitting display device may further include a reflection pattern under a lower surface of the second substrate, the reflection pattern corresponding to a boundary of the pixel area.

The reflection pattern may be outside the light absorption area.

The metal pattern may include substantially the same material as the reflection pattern.

Each of the metal pattern and the reflection pattern may have a reflectivity greater than about 0.9.

The organic light emitting display device may further include a lens part under a lower surface of the aperture, the lens part corresponding to the light absorption area.

The organic light emitting display device may further include a light detecting sensor under the lens part, the light detecting sensor for receiving light from the light absorption area.

The organic light emitting display device may further include a sealant sealing the first substrate and the second substrate.

The organic light emitting display device may further include a moisture absorber under a lower surface of the second substrate.

Each of the organic light emitting structures may include a red light emitting structure, a green light emitting structure, and a blue light emitting structure.

In an example embodiment of the present invention, an organic light emitting display device includes: a display panel including: a first substrate having a plurality of organic light emitting structures thereon, the organic light emitting structures defining a pixel area; a second substrate facing the first substrate to encapsulate the organic light emitting structures, the second substrate having a light absorption area; an aperture under a lower surface of the first substrate corresponding to the light absorption area; and an aperture controller under the lower surface of the first substrate, the aperture controller being adjacent to the aperture; and at least one camera integrally formed with the display panel, the camera including a lens part under the aperture corresponding to the light absorption area.

The organic light emitting display device may further include a plurality of cameras including the at least one camera. Here, the second substrate has a plurality of light absorption areas including the light absorption area, the light absorption areas corresponding to the cameras, and the display panel includes a plurality of apertures corresponding to the light absorption areas.

The cameras may be configured to detect a plurality of images having a predetermined parallax.

A portion of the pixel area may overlap the light absorption area.

The portion of the pixel area overlapping the light absorption area may include a light transmitting portion.

According to one or more example embodiments of the organic light emitting display device, the metal pattern and the reflection pattern may be used to detect a mirror image and to take a photograph without displaying an image on a display panel, thereby reducing power consumption of the organic light emitting display device.

Also, a photograph may be taken without driving an additional camera in the organic light emitting display device, thereby further reducing power consumption of the organic light emitting display device.

BRIEF DESCRIPTION OF THE DRAWINGS

The above and other features and aspects of the invention will become more apparent by describing detailed example embodiments thereof with reference to the accompanying drawings, in which.

DETAILED DESCRIPTION

Various example embodiments will be described more fully hereinafter with reference to the accompanying drawings, in which example embodiments are shown. Embodiments of the present invention may, however, be embodied in many different forms and should not be construed to be limited to the example embodiments set forth herein. Rather, these example embodiments are provided so that this disclosure will be thorough and complete, and will fully convey the scope of the invention to those skilled in the art.

In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or one or more intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in further detail with reference to the accompanying drawings.

Figure 1:
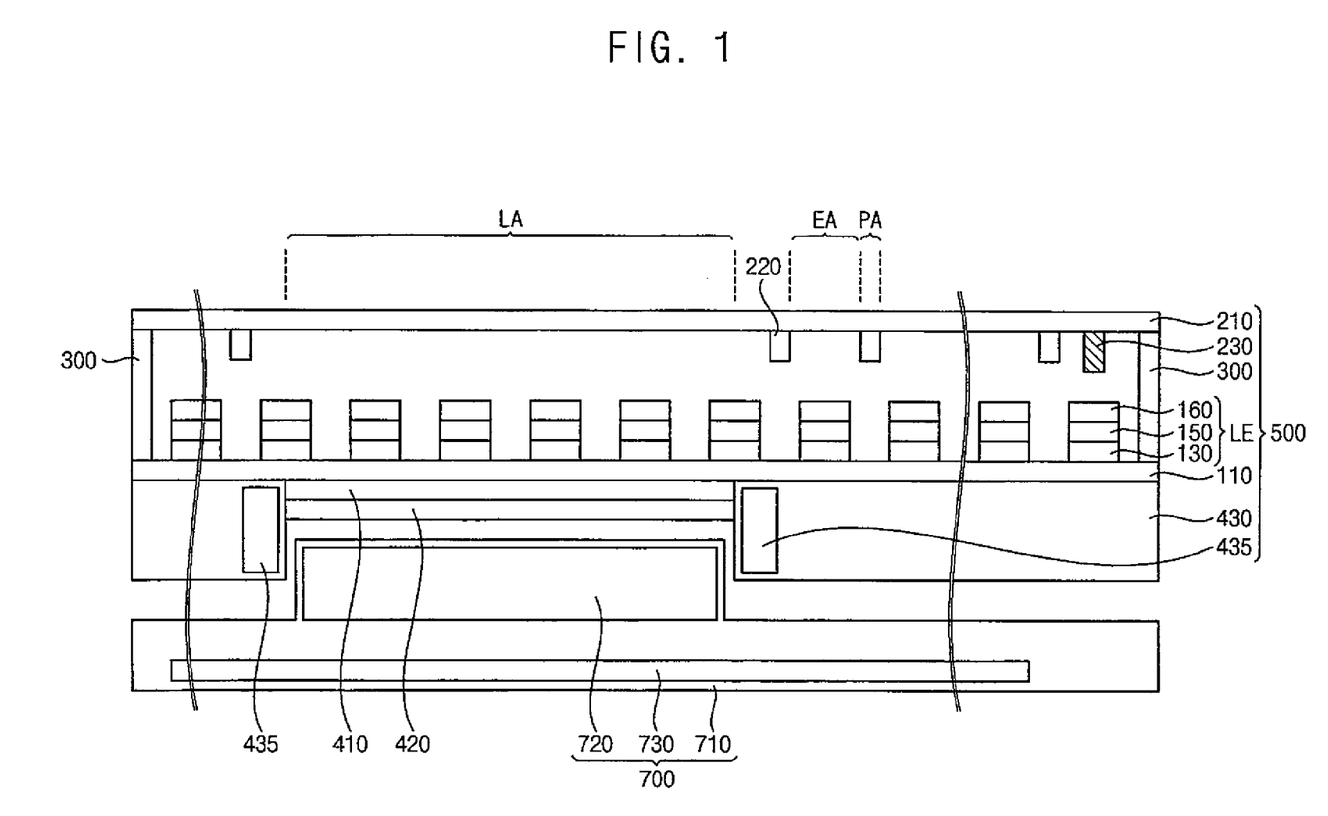
FIG. 1 is a cross-sectional view illustrating an organic light emitting display device according to an example embodiment of the invention.
Figure 2:
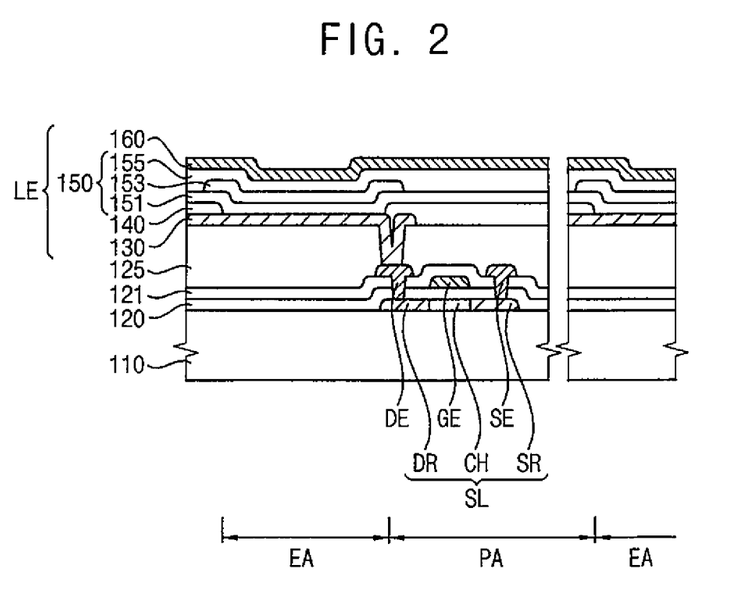
FIG. 2 is an enlarged cross-sectional view illustrating the organic light emitting display device of FIG. 1.

FIG. 1 is a cross-sectional view illustrating an organic light emitting display device according to an example embodiment of the invention. FIG. 2 is an enlarged cross-sectional view illustrating the organic light emitting display device of FIG. 1.

Referring to FIGS. 1 and 2, an organic light emitting display (hereinafter, "OLED") device according to the present embodiment of the invention includes a display panel 500 and a camera 700. The display panel 500 includes a first substrate 110, a second substrate 210 facing the first substrate 110 and having a light absorption area LA, an aperture 420 under a lower surface of the first substrate 110 corresponding to the light absorption area LA, and an aperture controller 435 under the lower surface of the first substrate 110 and adjacent the aperture 420. A plurality of organic light emitting structures LE defining pixel areas is on (e.g., disposed on) an upper surface of the first substrate 110. The second substrate 210 encapsulates the organic light emitting structures LE. Also, the display panel 500 may further include a switching element between the first substrate 110 and the light emitting structures LE. Furthermore, the display panel 500 may further include a metal pattern 410, a reflection pattern 220, a sealant 300, and a moisture absorber 230.

The first substrate 110 includes a transparent insulation material. For example, the first substrate 110 may include glass, quartz, plastic, polyethylene terephthalate resin, polyethylene resin, polycarbonate resin, etc. Also, the first substrate 110 may include a flexible substrate.

The switching element includes a semiconductor pattern SL, a gate insulation layer 120, a gate electrode GE, a first insulation layer 121, a drain electrode DE, a source electrode SE, and a second insulation layer 125.

The semiconductor pattern SL may be on the first substrate 110. The semiconductor pattern SL includes a channel region CH, a drain region DR and a source region SR. The drain region DR is electrically connected to the drain electrode DE. The source region SR is electrically connected to the source electrode SE. The channel region CH is between (e.g., disposed between) the drain region DR and the source region SR.

The gate insulation layer 120 may be on the first substrate 110 on which the semiconductor pattern SL is formed. The gate insulation layer 120 may cover the semiconductor pattern SL. The gate insulation layer 120 may include, for example, silicon oxide or silicon nitride.

The gate electrode GE is electrically connected to a gate line (not shown), and a gate on/off signal is applied to the gate electrode GE through the gate line. The gate electrode GE overlaps the channel region CH. The gate electrode GE may be integrally formed with the gate line.

The first insulation layer 121 may be on the first substrate 110 on which the gate electrode GE is formed. The first insulation layer 121 may cover the gate electrode GE. The first insulation layer 121 may include, for example, silicon oxide or silicon nitride.

The source electrode SE is electrically connected to the source region SR of the semiconductor pattern SL through a first contact hole formed in the gate insulation layer 120 and the first insulation layer 121. A data signal may be provided to the source electrode SE.

The drain electrode DE is electrically connected to the drain region DR of the semiconductor pattern SL through a second contact hole formed in the gate insulation layer 120 and the first insulation layer 121.

Although in FIG. 2 the switching element has a top-gate structure where a gate electrode GE is on the top of the semiconductor pattern SL, a switching element of an OLED device according to example embodiments of the invention is not limited thereto. For example, the switching element may have a bottom-gate structure where a gate electrode is under the semiconductor pattern SL.

The second insulation layer 125 may be on the first substrate 110 on which the source electrode SE and the drain electrode DE are formed. The second insulation layer 125 may cover the source electrode SE and the drain electrode DE. The second insulation layer 125 may have a substantially flat surface.

The organic light emitting structure LE includes a first electrode 130, a light emission element 150, and a second electrode 160. Also, the organic light emitting structure LE may further include a pixel defining pattern 140 between the light emission element 150 and the first electrode 130.

The first electrode 130 may be on the first substrate 110 on which the second insulation layer 125 is formed. The first electrode 130 is electrically connected to the drain electrode DE. The first electrode 130 may include a transparent or translucent electrode. For example, the first electrode 130 may include indium zinc oxide (IZO), indium tin oxide (ITO), zinc oxide (ZnOx), tin oxide (SnOx), etc. The first electrode 130 may be used as an anode for providing positive holes to the organic light emitting structure LE.

The light emission element 150 may include a hole injection layer ("HIL") and a hole transfer layer ("HTL") 151, an emission layer ("EML") 153, and an electron transfer layer ("ETL"), and an electron injection layer ("EIL") 155. The first electrode 130 provides positive holes to the HIL and HTL 151. The second electrode 160 provides electrons to the ETL and EIL 155. Each pair of positive holes and electrons is coupled within the EML 153 to generate light having a desired wavelength. For example, the light emission element 150 may include light emitting materials generating red light, green light, or blue light. In one embodiment, the light emission element 150 may include a plurality of light emitting materials each generating light having substantially different wavelengths.

The second electrode 160 may be on the first substrate 110 on which the light emission element 150 is formed. The second electrode 160 may include a reflective electrode. For example, the second electrode 160 may include a metal having a relatively high reflectivity such as aluminum (Al), platinum (Pt), silver (Ag), gold (Au), chromium (Cr), tungsten (W), molybdenum (Mo), titanium (Ti), or an alloy thereof. The second electrode 160 may be used as a cathode for providing electrons to the organic light emitting structure LE.

The second substrate 210 faces the first substrate 110 to encapsulate the organic light emitting structure LE. The second substrate 210 may include a transparent material. For example, the second substrate 210 may include glass, quartz, plastic, polyethylene terephthalate resin, polyethylene resin, polycarbonate resin, etc. Also, the second substrate 210 may include a flexible substrate. The second substrate 210 may include substantially the same material as the first substrate 110.

The second substrate 210 has a lower surface and an upper surface. The upper surface of the second substrate 210 faces outside. Also, the second substrate 210 includes the light absorption area LA through which an external light is transmitted. The reflection pattern 220 may be on the lower surface of the second substrate 210.

The reflection pattern 220 is at a peripheral area PA corresponding to a boundary of a pixel area EA. The pixel area EA is defined by the organic light emitting structures LE. The reflection pattern 220 has suitable (or desired) transmissivity and reflectivity. For example, reflectivity of the reflection pattern 220 may be greater than about 0.9. The reflection pattern 220 may include chromium (Cr), aluminum (Al), silver (Ag), tin (Sn), molybdenum (Mo), iron (Fe), platinum (Pt), mercury (Hg), etc. The reflection pattern 220 may provide a mirror image to a user using an external light when a display image is not represented on the OLED device.

The reflection pattern 220 may be outside the light absorption area LA. For example, an external light may be transmitted to the light absorption area LA when the display image is not represented without obstruction due to the reflection pattern 220.

The moisture absorber 230 may be on the lower surface of the second substrate 210. The display panel 500 may include at least one moisture absorber 230. For example, the moisture absorber 230 may include barium oxide, gallium oxide, calcium oxide, zeolite, or another metal oxide. According to an embodiment, the moisture absorber 230 may include a transparent porous nano-polymer layer (PNPL).

The sealant 300 seals the first substrate 110 and the second substrate 210 to protect the organic light emitting structures LE from the outside. The sealant 300 may include an ultraviolet hardener, such as an epoxy resin or a thermal hardener.

The aperture 420 and the aperture controller 435 may be under the lower surface of the first substrate 110. The metal pattern 410 may be under the lower surface of the first substrate 110.

The aperture 420 corresponds to the light absorption area LA. The aperture 420 may adjust an amount of light transmitted from outside. Although the aperture 420 includes a single layer in FIG. 1, the structure of the aperture 420 is not limited thereto. For example, the aperture 420 may have a plurality of light blocking layers stacked on each other to form a through hole. The adjustment of the light amount by the aperture 420 according to an example embodiment will be described in detail referring to FIG. 4.

In an embodiment, the aperture controller 435 is under the lower surface of the first substrate 110. An aperture controlling body 430 includes the aperture controller 435. The aperture controller 435 is adjacent to the aperture 420. When, for example, the light absorption area LA has a substantially circular shape, the aperture controller 435 may have a ring-shape surrounding the light absorption area LA. The aperture controller 435 adjusts the size of the through hole of the aperture 420, and may be controlled independently. According to an embodiment, the aperture controller 435 may be electrically connected to a controller of a camera 700 to be synchronized at a driving timing of the camera 700.

The metal pattern 410 may be under the lower surface of the first substrate 110. The metal pattern 410 may be between the first substrate 110 and the aperture 420. The metal pattern 410 has suitable (e.g., desired) transmissivity and reflectivity. For example, reflectivity of the metal pattern 410 may be greater than about 0.9. Also, the metal pattern 410 may include chromium (Cr), aluminum (Al), silver (Ag), tin (Sn), molybdenum (Mo), iron (Fe), platinum (Pt) or mercury (Hg). In an embodiment, the metal pattern 410 may include substantially the same material as the reflection pattern 220. The metal pattern 410 may provide a mirror image to a user using an external light when a display image is not represented on the OLED device.

The camera 700 is under the aperture 420, and includes a lens part 720 corresponding to the light absorption area LA. The camera 700 may further include a light detecting sensor 730. A camera body 710 of the camera 700 includes the lens part 720 and the light detecting sensor 730.

The lens part 720 may refract light transmitted from the light absorption area LA and the aperture 420. The lens part 720 may include at least one lens. For example, the lens part 720 may include a plurality of spherical lenses or aspherical lenses.

The light detecting sensor 730 may detect external light transmitted through the lens part 720. The light detecting sensor 730 may deliver a signal from the detected light to a controller of the OLED device so that a mirror image may be displayed on the display panel 500.

Figure 3:
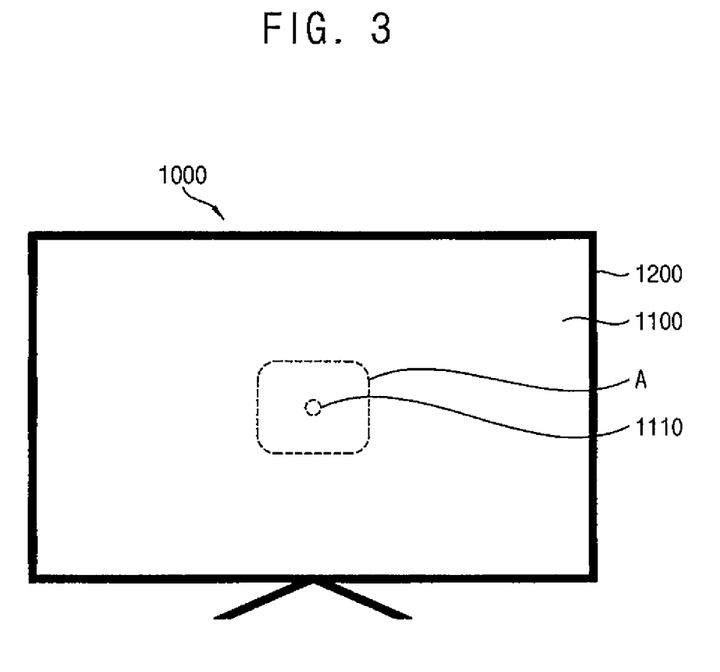
FIG. 3 is a front view illustrating the organic light emitting display device of FIG. 1.
Figure 4:
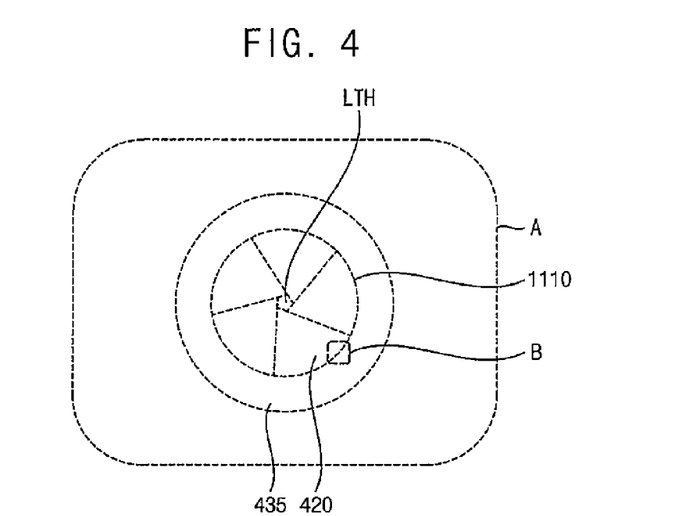
FIG. 4 is an enlarged plan view illustrating a portion 'A' of FIG. 3.
Figure 5:
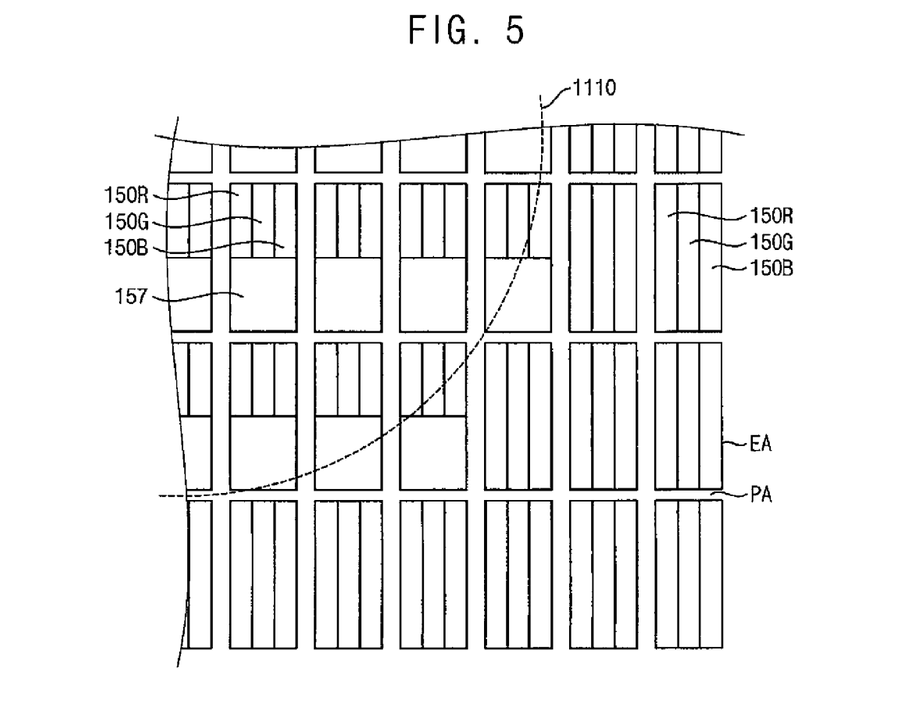
FIG. 5 is an enlarged plan view illustrating a portion 'B' of FIG. 4.

FIG. 3 is a front view illustrating an embodiment of the organic light emitting display device of FIG. 1. FIG. 4 is an enlarged plan view illustrating a portion 'A' of FIG. 3, according to an embodiment. FIG. 5 is an enlarged plan view illustrating a portion 'B' of FIG. 4, according to an embodiment.

Referring to FIG. 3, an OLED device 1000 according to the present embodiment includes a screen 1100 and a bezel 1200. The screen 1100 includes at least one image detecting region 1110 corresponding to the light absorption area LA. An image provided from the display panel 500 is represented on the screen 1100. For example, a predetermined color image may be represented on the screen 1100 when the organic light emitting structure LE emits color light. A mirror image, reflected by the reflection pattern 220 and the metal pattern 410, may be represented on the screen 1100 when the organic light emitting structure LE does not emit light.

Referring to FIG. 4, the image detection region 1110 includes an aperture 420 blocking external light and a through hole LTH transmitting the external light. The aperture 420 may include a plurality of light blocking patterns partially overlapped with each other. The through hole LTH may be formed within the image detection region 1110. The size or shape of the through hole LTH may be determined by an open area of the aperture 420. The open area of the aperture 420 may be controlled by the aperture controller 435. Although in FIG. 4 the aperture 420 includes five light blocking patterns overlapped with each other and the through hole LTH has a pentangular shape at a center of the image detection region 1110, the number, shape, and position of the light blocking patterns or the through hole LTH are not limited thereto. For example, the number of the light blocking patterns may be twelve, and the through hole LTH may have a dodecagonal shape. In another embodiment, an overlapped line of the light blocking patterns may be curved, and the through hole LTH may be positioned away from the center of the image detection region 1110.

Referring to FIG. 5, the light absorption area LA corresponding to the image detection region 1110 may overlap a pixel area EA. The pixel area EA overlapping the light absorption area LA includes a light transmitting portion 157. In an example embodiment, the pixel area EA overlapping the light absorption area LA may include a red light emitting portion 150R, green light emitting portion 150G, blue light emitting portion 150B, and a light transmitting portion 157. Pixel areas EA outside the light absorption area LA may include red light emitting portion 150R, green light emitting portion 150G and blue light emitting portion 150B. A boundary of the pixel area EA corresponds to peripheral area PA. Although in FIG. 5 the pixel area EA overlapping the light absorption area LA includes the light transmitting portion 157 having a substantially rectangular shape and disposed under the light emitting portions 150R, 150G, 150B, the size, shape or position of the light transmitting portion 157 is not limited thereto. For example, the size or shape of the light transmitting portion 157 may be adjusted by an open area of the aperture 420. According to one embodiment, the pixel areas EA that are completely outside of the image detection region 1110 (or the light absorption area LA) do not include light transmitting portions 157.

As mentioned above, according to the OLED device 1000 of example embodiments of the invention, the metal pattern 410 and the reflection pattern 220 may be used to detect a mirror image and to take a photograph without displaying an image on a display panel 500, thereby reducing power consumption of the OLED device 1000.

Also, a photograph may be taken without driving an additional camera 700 in the OLED device 1000, thereby further reducing power consumption of the OLED device 1000.

Figure 6:
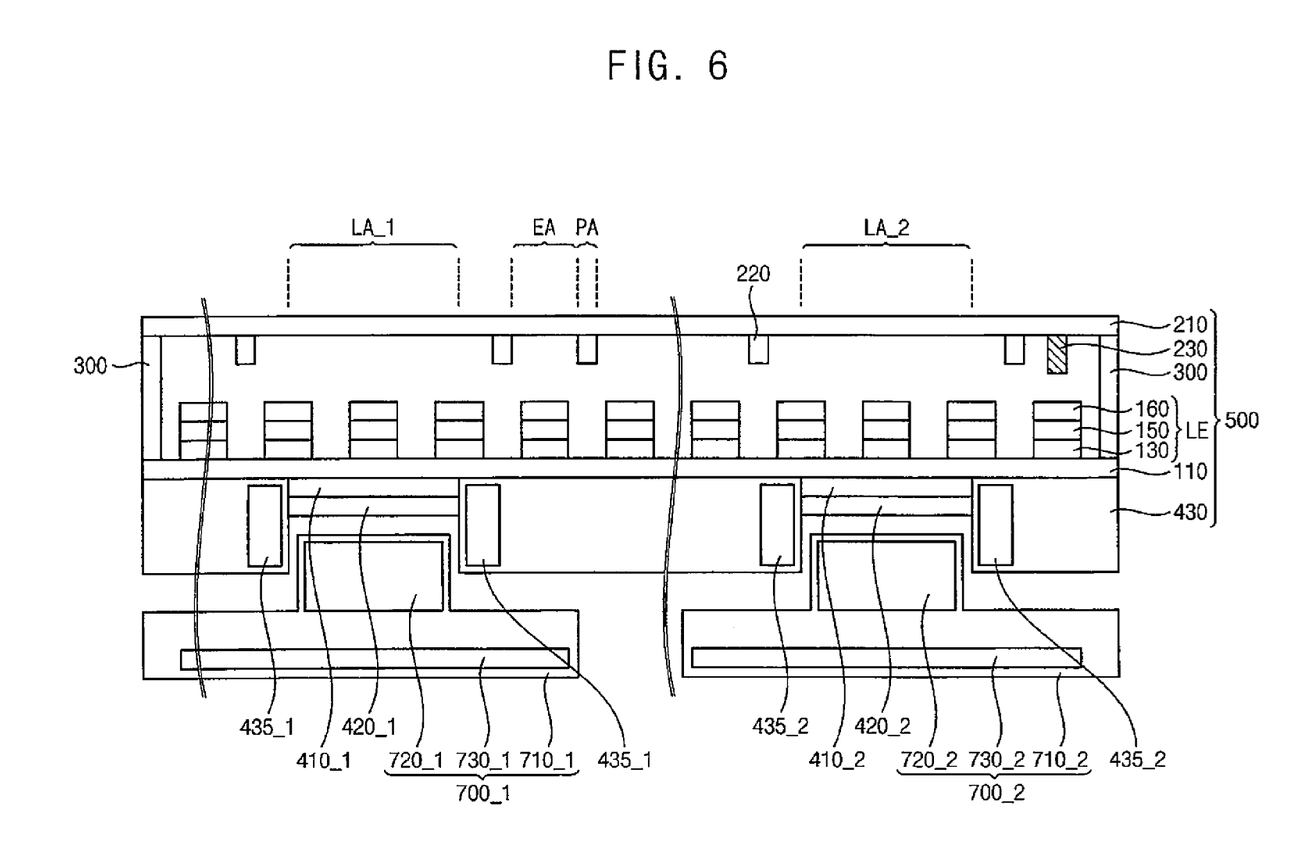
FIG. 6 is a cross-sectional view illustrating an organic light emitting display device according to another example embodiment of the invention.
Figure 7:
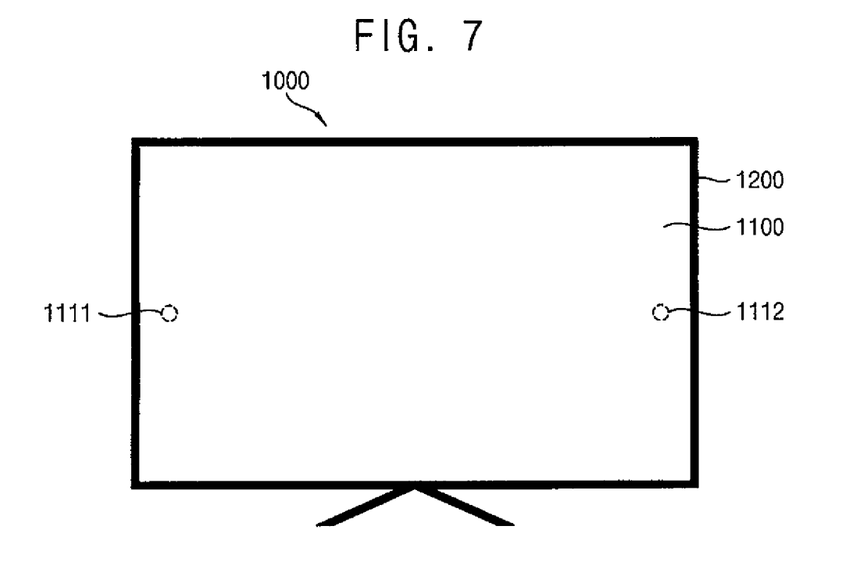
FIG. 7 is a front view illustrating the organic light emitting display device of FIG. 6.
Figure 8:
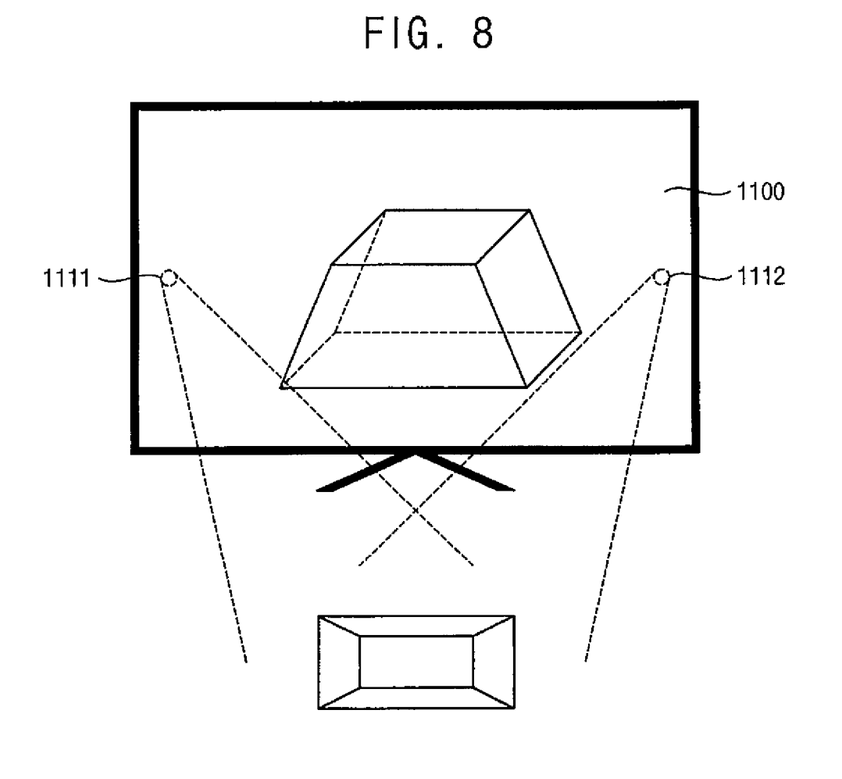
FIG. 8 is a front view illustrating an implementation of the organic light emitting display device of FIG. 6.

FIG. 6 is a cross-sectional view illustrating an organic light emitting display device according to another example embodiment of the invention. FIG. 7 is a front view illustrating the organic light emitting display device of FIG. 6. FIG. 8 is a front view illustrating an implementation of the organic light emitting display device of FIG. 6.

The OLED device according to the present embodiment is substantially the same as the OLED device illustrated in FIGS. 1 to 5 except for light absorption areas LA_1, LA2, metal patterns 410_1, 410_2, apertures 420_1, 420_2, aperture controllers 435_1, 435_2, and cameras 700_1, 700_2. Details of elements identical (or substantially similar) to the above-described embodiments are given by way of reference to the above-described embodiments.

Referring to FIG. 6, an OLED device according to the present embodiment includes a display panel 500 and a plurality of cameras. For example, the OLED device may include two cameras 700_1, 700_2. The OLED device may include two apertures 420_1, 402_2 and two aperture controllers 435_1, 435_2 under a first substrate 110 of the display panel 500. The OLED device may further include two metal patterns 410_1, 410_2 under the first substrate 110.

The apertures 420_1, 420_2 corresponds to light absorption areas LA_1, LA_2, respectively. The apertures 420_1, 420_2 may adjust an amount of light provided through the light absorption areas LA_1, LA_2 from outside.

The aperture controllers 435_1, 435_2 may be under a lower surface of the first substrate 110. An aperture controlling body 430 includes the aperture controllers 435_1, 4352. The aperture controllers 435_1, 435_2 are adjacent to the apertures 420_1, 420_2 respectively. For example, when the light absorption areas LA_1, LA_2 have substantially circular shapes, the aperture controllers 435_1, 435_2 may have ring-shapes surrounding the light absorption areas LA_1, LA_2 respectively. The aperture controllers 435_1, 435_2 adjust the sizes of through holes of the apertures 420_1, 420_2, and may be controlled independently. In an embodiment of the present invention, the aperture controllers 435_1, 435_2 may be electrically connected to a controller of cameras 700_1, 700_2 to be synchronized at a driving timing of the cameras 700_1, 700_2.

The metal patterns 410_1, 410_2 may be under the lower surface of the first substrate 110. The metal patterns 410_1, 410_2 may be between the first substrate 110 and the apertures 420_1, 420_2. Each of the metal patterns 410_1, 410_2 has a suitable (or desired) transmissivity and reflectivity. For example, reflectivity of the metal patterns 410_1, 410_2 may be greater than about 0.9. Also, the metal patterns 410_1, 410_2 may include chromium (Cr), aluminum (Al), silver (Ag), tin (Sn), molybdenum (Mo), iron (Fe), platinum (Pt) or mercury (Hg). The metal patterns 410_1, 410_2 may provide a mirror image to a user using external light when a display image is not represented on the OLED device.

The cameras 700_1, 700_2 are under the apertures 420_1, 420_2, and include lens parts 720_1, 720_2 corresponding to the light absorption areas LA_1, LA_2 respectively. The cameras 700_1, 700_2 may further include light detecting sensors 730_1, 730_2. Camera bodies 710_1, 710_2 of the cameras 700_1, 700_2 include the lens parts 720_1, 7202 and the light detecting sensors 730_1, 730_2.

The lens parts 720_1, 720_2 may refract light transmitted from the light absorption areas LA_1, LA_2 and the apertures 420_1, 420_2. The lens parts 720_1, 720_2 may include at least one lens. For example, the lens parts 720_1, 720_2 may include a plurality of spherical lenses or aspherical lenses.

The light detecting sensors 730_1, 730_2 may detect external light transmitted through the lens parts 720_1, 720_2. The light detecting sensors 730_1, 730_2 may deliver a signal from the detected light to a controller of the OLED device so that a mirror image may be displayed on the display panel 500.

Referring to FIG. 7, the OLED device 1000 includes a screen 1100 and a bezel 1200. The screen 1100 may, for example, include two image detecting regions 1111, 1112. The image detecting regions 1111, 1112 may correspond to the light absorption areas LA_1, LA_2 respectively.

Referring to FIG. 8, incident light through the image detecting regions 1111, 1112 provide an image having a desired parallax with respect to a body or a scene. For example, when the image detecting regions 1111, 1112 are spaced apart from each other in a horizontal direction, the cameras 700_1, 700_2 may detect slightly different images having the parallax by the incident light through the image detecting regions 1111, 1112. Accordingly, a stereoscopic image may be displayed on the screen 1100.

According to one or more example embodiment of the OLED device, the metal patterns 410_1, 410_2 and the reflection pattern 220 may be used to detect a mirror image and to take a photograph without displaying a stereoscopic image having a desired parallax on a display panel 500, thereby reducing power consumption of the OLED device.

Example embodiments of the invention may be applied to any electronic devices including an OLED device. For example, example embodiments of the invention may be applied to a television, a computer monitor, a notebook, a digital camera, a cellular phone, a smartphone, a tablet computer, a PDA, a PMP, a MP3 player, a navigation system, a video camera recorder, a mobile game consoles, etc.

The foregoing are illustrative of example embodiments and are not to be construed as limiting thereof. Although a few example embodiments have been described, those skilled in the art will readily appreciate that many modifications are possible in example embodiments without materially departing from the novel teachings and features of the present invention. Accordingly, all such modifications are intended to be included within the scope of embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. An organic light emitting display device comprising:
   a first substrate having a plurality of organic light emitting structures thereon, the organic light emitting structures defining a pixel area;
   a second substrate facing the first substrate to encapsulate the organic light emitting structures, the second substrate having a light absorption area;
   an aperture under a lower surface of the first substrate corresponding to the light absorption area; and an aperture controller under the lower surface of the first substrate, the aperture controller being adjacent to the aperture.

2. The organic light emitting display device of claim 1, wherein each of the organic light emitting structures comprises a first electrode, an organic light emitting element on the first electrode, and a second electrode on the organic light emitting element.

3. The organic light emitting display device of claim 1, wherein a portion of the pixel area overlaps the light absorption area.

4. The organic light emitting display device of claim 3, wherein the portion of the pixel area overlapping the light absorption area comprises a light transmitting portion.

5. The organic light emitting display device of claim 4, wherein a size or a shape of the light transmitting portion is adjustable according to an open area of the aperture.

6. The organic light emitting display device of claim 1, further comprising a metal pattern between the first substrate and the aperture.

7. The organic light emitting display device of claim 6, further comprising a reflection pattern under a lower surface of the second substrate, the reflection pattern corresponding to a boundary of the pixel area.

8. The organic light emitting display device of claim 7, wherein the reflection pattern is outside the light absorption area.

9. The organic light emitting display device of claim 7, wherein the metal pattern comprises substantially the same material as the reflection pattern.

10. The organic light emitting display device of claim 9, wherein each of the metal pattern and the reflection pattern has a reflectivity greater than about 0.9.

11. The organic light emitting display device of claim 1, further comprising a lens part under a lower surface of the aperture, the lens part corresponding to the light absorption area.

12. The organic light emitting display device of claim 11, further comprising a light detecting sensor under the lens part, the light detecting sensor for receiving light from the light absorption area.

13. The organic light emitting display device of claim 1, further comprising a sealant sealing the first substrate and the second substrate.

14. The organic light emitting display device of claim 1, further comprising a moisture absorbent under a lower surface of the second substrate.

15. The organic light emitting display device of claim 1, wherein each of the organic light emitting structures comprises a red light emitting structure, a green light emitting structure, and a blue light emitting structure.

16. An organic light emitting display device comprising:
a display panel comprising:
a first substrate having a plurality of organic light emitting structures thereon, the organic light emitting structures defining a pixel area;
a second substrate facing the first substrate to encapsulate the organic light emitting structures, the second substrate having a light absorption area;
an aperture under a lower surface of the first substrate corresponding to the light absorption area; and
an aperture controller under the lower surface of the first substrate, the aperture controller being adjacent to the aperture; and
at least one camera integrally formed with the display panel, the camera comprising a lens part under the aperture corresponding to the light absorption area.

17. The organic light emitting display device of claim 16, further comprising a plurality of cameras comprising the at least one camera,
wherein the second substrate has a plurality of light absorption areas comprising the light absorption area, the light absorption areas corresponding to the cameras, and
wherein the display panel comprises a plurality of apertures corresponding to the light absorption areas.

18. The organic light emitting display device of claim 17, wherein the cameras are configured to detect a plurality of images having a predetermined parallax.

19. The organic light emitting display device of claim 16, wherein a portion of the pixel area overlaps the light absorption area.

20. The organic light emitting display device of claim 19, wherein the portion of the pixel area overlapping the light absorption area comprises a light transmitting portion.

* * * * *